United States Patent
Newbury et al.

(10) Patent No.: US 8,865,556 B2
(45) Date of Patent: Oct. 21, 2014

(54) USING FAST ANNEAL TO FORM UNIFORM NI(PT)SI(GE) CONTACTS ON SIGE LAYER

(75) Inventors: Joseph S. Newbury, Irvington, NY (US); Kenneth Parker Rodbell, Sandy Hook, CT (US); Zhen Zhang, Ossining, NY (US); Yu Zhu, West Harrison, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/611,893

(22) Filed: Sep. 12, 2012

(65) Prior Publication Data

US 2014/0054700 A1  Feb. 27, 2014

Related U.S. Application Data

(63) Continuation of application No. 13/593,725, filed on Aug. 24, 2012.

(51) Int. Cl.
| | | |
|---|---|---|
| H01L 29/78 | (2006.01) | |
| H01L 21/8238 | (2006.01) | |
| H01L 21/02 | (2006.01) | |

(52) U.S. Cl.
USPC ........... 438/300; 438/795; 438/581; 438/582; 438/630; 438/649; 438/650; 438/933; 438/655; 438/664; 438/721; 257/E21.347; 257/377; 257/382; 257/347; 257/384; 257/E29.156; 257/E29.161; 257/E21.13; 257/E21.165; 257/E21.199

(58) Field of Classification Search
CPC ...................... H01L 21/0245; H01L 29/66636; H01L 29/045; H01L 29/7848; H01L 21/02532; H01L 21/02639; H01L 21/823807; H01L 21/823814; H01L 29/165; H01L 21/285; H01L 29/78; H01L 29/417; H01L 21/324
USPC ......... 438/795, 581–583, 630, 649–651, 655, 438/664, 682, 721, 753–755, 300, 933; 257/E21.347, 377, 382, 384, E29.156, 257/E29.161, E21.13, E21.165, E21.199, 257/E21.619, E21.634, E27.112, E21.32, 257/347
See application file for complete search history.

(56) References Cited

U.S. PATENT DOCUMENTS

| | | | | |
|---|---|---|---|---|
| 6,376,342 | B1 * | 4/2002 | Tseng | 438/517 |
| 6,429,054 | B1 * | 8/2002 | Krishnan et al. | 438/149 |
| 6,521,515 | B1 * | 2/2003 | Kluth | 438/486 |
| 6,852,600 | B1 * | 2/2005 | Wang et al. | 438/301 |
| 7,132,683 | B1 * | 11/2006 | Krishnan et al. | 257/40 |
| 7,176,481 | B2 | 2/2007 | Chen et al. | |

(Continued)

*Primary Examiner* — Jarrett Stark
*Assistant Examiner* — Bitew Dinke
(74) *Attorney, Agent, or Firm* — Louis J. Percello; Michael J. Chang, LLC

(57) ABSTRACT

Techniques for forming a smooth silicide without the use of a cap layer are provided. In one aspect, a FET device is provided. The FET device includes a SOI wafer having a SOI layer over a BOX and at least one active area formed in the wafer; a gate stack over a portion of the at least one active area which serves as a channel of the device; source and drain regions of the device adjacent to the gate stack, wherein the source and drain regions of the device include a semiconductor material selected from: silicon and silicon germanium; and silicide contacts to the source and drain regions of the device, wherein an interface is present between the silicide contacts and the semiconductor material, and wherein the interface has an interface roughness of less than about 5 nanometers.

12 Claims, 5 Drawing Sheets

(56) References Cited

U.S. PATENT DOCUMENTS

| | | | |
|---|---|---|---|
| 7,781,322 B2* | 8/2010 | Ku et al. | 438/592 |
| 8,344,447 B2* | 1/2013 | Lin et al. | 257/327 |
| 2003/0089901 A1* | 5/2003 | Fitzgerald | 257/19 |
| 2004/0161917 A1* | 8/2004 | Hizawa | 438/592 |
| 2004/0219767 A1* | 11/2004 | Arena et al. | 438/479 |
| 2005/0252443 A1* | 11/2005 | Tsai et al. | 117/84 |
| 2005/0287752 A1* | 12/2005 | Nouri et al. | 438/303 |
| 2006/0040433 A1* | 2/2006 | Sadaka et al. | 438/151 |
| 2006/0166492 A1* | 7/2006 | Orlowski et al. | 438/637 |
| 2007/0012913 A1* | 1/2007 | Ohta et al. | 257/19 |
| 2007/0045849 A1 | 3/2007 | Ke et al. | |
| 2007/0249149 A1* | 10/2007 | Deshpande et al. | 438/592 |
| 2007/0290280 A1* | 12/2007 | Kwon et al. | 257/412 |
| 2007/0298557 A1* | 12/2007 | Nieh et al. | 438/197 |
| 2008/0067609 A1* | 3/2008 | Kim et al. | 257/384 |
| 2008/0070370 A1* | 3/2008 | Wu et al. | 438/301 |
| 2008/0119031 A1* | 5/2008 | Pal et al. | 438/483 |
| 2009/0004853 A1* | 1/2009 | Bu et al. | 438/664 |
| 2009/0039388 A1* | 2/2009 | Teo et al. | 257/190 |
| 2009/0206413 A1* | 8/2009 | Cabral et al. | 257/369 |
| 2010/0090289 A1* | 4/2010 | Yang et al. | 257/369 |
| 2011/0092057 A1* | 4/2011 | Suvorov | 438/522 |
| 2011/0101418 A1* | 5/2011 | Murthy et al. | 257/190 |
| 2011/0127617 A1* | 6/2011 | Scheiper et al. | 257/402 |
| 2011/0256681 A1* | 10/2011 | Lin et al. | 438/285 |
| 2011/0287611 A1* | 11/2011 | Cheng et al. | 438/478 |
| 2012/0025313 A1* | 2/2012 | Chang et al. | 257/347 |
| 2012/0126311 A1* | 5/2012 | Snyder | 257/329 |
| 2012/0261725 A1* | 10/2012 | Flachowsky et al. | 257/288 |
| 2013/0087857 A1* | 4/2013 | Ko et al. | 257/368 |

* cited by examiner

USING FAST ANNEAL TO FORM UNIFORM NI(PT)SI(GE) CONTACTS ON SIGE LAYER

CROSS-REFERENCE TO RELATED APPLICATION(S)

This application is a continuation of U.S. application Ser. No. 13/593,725 filed on Aug. 24, 2012, the disclosure of which is incorporated by reference herein.

FIELD OF THE INVENTION

The present invention relates to silicide formation and more particularly, to techniques for forming a smooth silicide without the use of a cap layer.

BACKGROUND OF THE INVENTION

Embedded silicon germanium (SiGe) has recently been used as the source/drain material to boost channel hole mobility (due to the stress induced by lattice mismatch). Nickel platinum (NiPt) silicide is the standard contact metal to the SiGe, however NiPt—SiGe reaction under normal rapid thermal anneal (RTA) results in bad interface morphology (silicide spikes).

Silicide spikes into the SiGe source/drain may cause severe stress loss or junction leakage. This bad interface morphology issue becomes even worse when the percentage of germanium (Ge) is increased.

Conventional approaches to deal with the problem include using a silicon (Si) or SiGe cap layer with a lower percentage of Ge in order to improve the surface morphology. Namely, the cap layer reacts with the NiPt to form the NiSi, thus avoiding the interface morphology problem. However, employing a cap layer in a fabrication process flow increases both production complexity and cost.

Therefore, techniques that avoid bad interface morphology in SiGe source/drain contact formation without introducing the complexity and cost of using a cap layer would be desirable.

SUMMARY OF THE INVENTION

The present invention provides techniques for forming a smooth silicide without the use of a cap layer. In one aspect of the invention, a cap layer-free method for forming a silicide is provided. The method includes the following steps. A semiconductor material selected from: silicon and silicon germanium is provided. At least one silicide metal is deposited on the semiconductor material. The semiconductor material and the at least one silicide metal are annealed at a temperature of from about 400° C. to about 800° C. for a duration of less than or equal to about 10 milliseconds to form the silicide.

In another aspect of the invention, a method for fabricating a field-effect transistor (FET) device is provided. The method includes the following steps. A silicon-on-insulator (SOI) wafer having a SOI layer over a buried oxide (BOX) is provided. At least one active area is formed in the wafer. A gate stack is formed over a portion of the at least one active area which will serve as a channel of the device. Source and drain regions of the device are formed adjacent to the gate stack, wherein the source and drain regions of the device include a semiconductor material selected from: silicon and silicon germanium. At least one silicide metal is deposited on the wafer. The semiconductor material and the at least one silicide metal are annealed at a temperature of from about 400° C. to about 800° C. for a duration of less than or equal to about 10 milliseconds to form silicide contacts to the source and drain regions of the device.

In yet another aspect of the invention, a FET device is provided. The FET device includes a SOI wafer having a SOI layer over a BOX and at least one active area formed in the wafer; a gate stack over a portion of the at least one active area which serves as a channel of the device; source and drain regions of the device adjacent to the gate stack, wherein the source and drain regions of the device include a semiconductor material selected from: silicon and silicon germanium; and silicide contacts to the source and drain regions of the device, wherein an interface is present between the silicide contacts and the semiconductor material, and wherein the interface has an interface roughness of less than about 5 nanometers.

A more complete understanding of the present invention, as well as further features and advantages of the present invention, will be obtained by reference to the following detailed description and drawings.

DETAILED DESCRIPTION OF PREFERRED EMBODIMENTS

Provided herein are techniques for forming a metal (such as, but not limited to, nickel platinum (NiPt) silicide) on a silicon germanium (SiGe) material which avoid interface morphology issues commonly associated with metal silicide formation on a SiGe material (see above) without the use of a cap layer, which advantageously lowers the complexity and cost of the fabrication process as compared to conventional processes. Namely, in the present techniques a fast anneal (flash anneal or laser anneal) is employed rather than a conventional rapid thermal anneal to form metal silicide on SiGe (with no cap layer). The result (as provided in detail below) is a very smooth metal silicide.

Figure 1:
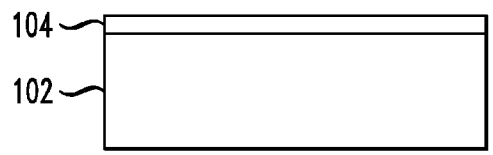
FIG. 1 is a cross-sectional diagram illustrating a silicide metal having been deposited onto a semiconductor material (e.g., silicon or silicon germanium) according to an embodiment of the present invention.
Figure 2:
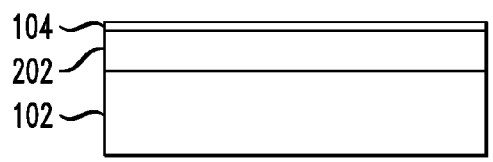
FIG. 2 is a cross-sectional diagram illustrating a fast anneal (e.g., flash anneal or laser anneal) having been used to react the metal with the semiconductor material to form a silicide according to an embodiment of the present invention.
Figure 3:
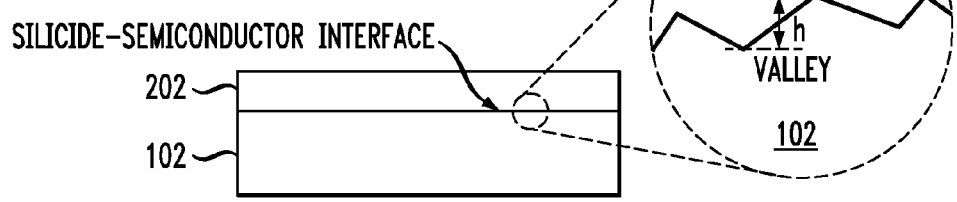
FIG. 3 is a cross-sectional diagram illustrating an optional step of removing any unreacted metal following the silicide reaction according to an embodiment of the present invention.

An overview of the present techniques will first be provided by way of reference to FIGS. 1-3, followed by an exemplary implementation of the present techniques to form source and drain contacts in an exemplary field-effect transistor (FET) device illustrated by way of reference to FIGS. 4-7. FIG. 1 is a cross-sectional diagram illustrating an exemplary starting semiconductor material 102 for the process. According to an exemplary embodiment, semiconductor material 102 is a silicon (Si) or SiGe material. In the exemplary FET fabrication process flow described below, the starting semiconductor material is an embedded in-situ boron doped SiGe or implantation or in-situ doped Si source/drain of the device.

A pre-silicide clean may be performed on the semiconductor material 102 (prior to metal deposition, see below) to remove native oxide. Suitable pre-silicide clean treatments to remove native oxide include, but are not limited to, hydrofluoric acid (HF) and reactive pre-clean (RPC).

Next, as shown in FIG. 1, a silicide metal or metals 104 is/are deposited onto the material. Suitable silicide metals include, but are not limited to, nickel (Ni), platinum (Pt), titanium (Ti), tantalum (Ta), cobalt (Co), tungsten (W) and combinations including at least one of the foregoing metals, such as nickel platinum (NiPt) and titanium platinum (TiPt). The metal(s) 104 may be deposited onto the semiconductor material 102 using, e.g., evaporation or sputtering.

A fast anneal is then used to react the metal(s) 104 with the semiconductor material 102 to form a silicide 202. See FIG. 2. Advantageously, it has been found by way of the present techniques that employing a high temperature, short duration anneal will result in a very smooth interface (see results described below), without the need for a capping layer. According to an exemplary embodiment, during this annealing step the metal/semiconductor material is heated to a temperature of from about 400° C. to about 800° C. for a duration of less than or equal to about 10 milliseconds, e.g., from about 1 microsecond to about 10 milliseconds. Such annealing conditions can be achieved using a flash or laser annealing process. According to an exemplary embodiment, the semiconductor material is preheated to an initial temperature of from about 150° C. to about 350° C. prior to the fast anneal. By way of example only, the semiconductor material can be heated using a back lamp, e.g., wherein the back/bottom side of the semiconductor material is heated and the fast anneal is performed on the top.

As shown in FIG. 3, any unreacted metal(s) 104 can be removed using a wet etching process. By way of example only, a suitable wet etching process for removing unreacted metal includes (but is not limited to) a soak in $H_2O:HCl:HNO_3=4:5:1$ for 10 minutes at 40 degrees Celsius (° C.). This step is optional. Namely, in the case of formation of a self-aligned silicide process (such as in the case of self-aligned silicide source and drain contacts, see description of FIGS. 4-7, below), it is desirable to remove the unreacted metal. However in the case of a trench silicide process, for example, removal of the unreacted metal might not be necessary.

As provided above, use of the present process results in a very smooth metal silicide interface with the underlying semiconductor material 102 advantageously without the use of a cap layer. The smoothness of the interface may be quantified based on interface roughness. As shown in FIG. 3, the interface between the silicide and the underlying semiconductor material, at a microscopic level (as depicted in the magnified view) is not perfectly smooth. The roughness at the interface (interface roughness) is made up of a plurality of peaks and valleys. According to an exemplary embodiment, the interface roughness is quantified based on an average height h between the peaks and valleys which according to the present techniques is less than about 5 nanometers (nm), e.g., from about 0.1 nm to about 5 nm, and that is considered herein to be a smooth interface. Interface roughness is further described in U.S. Pat. No. 6,521,515 issued to Kluth, entitled "Deeply Doped Source/Drains for Reduction of Silicide/Silicon interface Roughness," the contents of which are incorporated by reference herein.

Further, the present teachings achieve this smooth interface without a cap layer. As described above, with conventional techniques in order to avoid a rough interface, a silicon (Si) or SiGe cap layer with a lower percentage of Ge is typically employed. Use of such a cap layer will result in a non-uniform distribution of Ge in the semiconductor material beneath the silicide (e.g., a lower amount of Ge will be present at the top of the semiconductor material due to the presence of the cap layer). By comparison, with the present techniques (because no cap layer is used) the concentration of Ge will be uniform throughout the underlying semiconductor material 102. Thus, according to an exemplary embodiment, wherein the semiconductor material contains Ge (e.g., SiGe), post-silicide formation the Ge concentration in the underlying semiconductor material 102 does not vary by more than 3 percent (%) anywhere in the underlying semiconductor material 102 (which is considered herein to be a uniform concentration). Thus, the Ge concentration of a sample taken from any given first portion of the present underlying semiconductor material 102 will not vary by ±3% from the Ge concentration taken from any given second portion of underlying semiconductor material 102. It is notable that in the above example the concentration of Ge in the silicide might be uniform or it might not be uniform. Both scenarios are anticipated by the present techniques. The uniformity of the Ge concentration in the resulting silicide can be dependent on the uniformity of the concentration of the (pre-silicide) semiconductor material. Using the above measure of uniformity, if the SiGe concentration in the (pre-silicide) semiconductor material 102 does not vary by more than 3% anywhere in the (pre-silicide) semiconductor material 102, then a uniform Ge concentration throughout the silicide can also be achieved wherein a concentration of germanium in the silicide contacts does not vary by more than 3 percent anywhere in the silicide contacts (i.e., wherein the Ge concentration of a sample taken from any given first portion of the present silicide will not vary by ±3% from the Ge concentration taken from any given second portion of the silicide). However, as provided above, both a uniform and a non-uniform silicide composition are anticipated herein.

An exemplary implementation of the present techniques to fabricate source and drain contacts in a FET device is now provided by way of reference to FIGS. 4-7. It is however notable that the present techniques are more broadly applicable to any scenario in which silicide formation is desired on a semiconductor (Si, SiGe, etc.) material. The example shown in FIGS. 4-7 is thus provided merely to further illustrate the present techniques. Any of the above-described materials and/or processes (see description of FIGS. 1-3) may be employed in this example.

Figure 4:
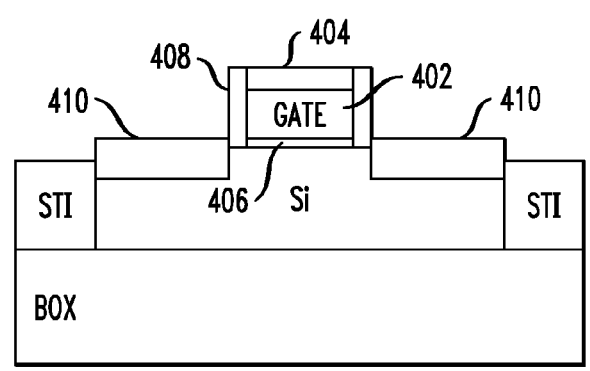
FIG. 4 is a cross-sectional diagram illustrating a starting structure for a field-effect transistor (FET) device fabrication process having a gate stack and source and drain regions formed adjacent to/on opposite sides of the gate stack according to an embodiment of the present invention.

FIG. 4 is a cross-sectional diagram illustrating a FET device for which self-aligned contacts will be formed using the present techniques. By way of example only, as shown in FIG. 4, the starting platform for the FET fabrication process is an Si layer over a buried oxide (BOX). This type of wafer configuration is also referred to as a silicon-on-insulator (SOI) wafer where the insulator is the BOX. An active area is defined in the wafer using shallow trench isolation (STI). As known by those of skill in the art, STI involves patterning trenches in the wafer that, in this example, extend through the SOI layer, and then filing the trenches with an insulator material such as an oxide.

A gate stack 402 is formed over the active area (i.e., over a portion of the active area which will serve as a channel of the device). While represented schematically in the figures as a single block, it is to be understood that gate stack 402 may include a single or multiple layers of a respective gate material(s). Suitable gate materials include, but are not limited to, a metal(s) and/or doped polysilicon. Standard processes may be employed to fabricate the gate stack 402. For instance, the gate stack material(s) may be deposited onto the wafer. A hardmask 404 may be formed on the gate stack materials and used to pattern a gate line(s) of the device, resulting in gate stack 402.

An optional gate dielectric 406 may be present between the gate stack 402 and a portion of the active area that will serve as a channel of the device. In general a FET includes a source region and a drain region interconnected by a channel and a gate (in this case gate stack 402) that regulates electron flow through the channel. By way of example only, when the gate stack 402 includes metal(s), then a suitable gate dielectric material includes, but is not limited to, a high-k dielectric. When the gate stack 402 includes doped poly silicon, a suitable gate dielectric material includes an oxide, such as silicon dioxide.

Optional spacers 408 are formed on opposite sides of the gate stack 402. As shown in FIG. 4, gate spacers are present on opposite sides of the gate stack 402. According to an exemplary embodiment, the spacers can be formed from a nitride material, such as (but not limited to) silicon nitride. Standard techniques are employed to form the spacers. For example, the spacer material can be blanket deposited over the structure and then reactive ion etching (RIE) can be used to form the spacers.

Source and drain regions 410 are formed adjacent to the gate stack 402. According to an exemplary embodiment, the source and drain regions 410 are embedded in situ boron doped SiGe source and drain regions. The process for forming in situ doped embedded SiGe source and drain regions by epitaxy are described, for example, in U.S. Pat. No. 7,176,481 issued to Chen et al., entitled "In Situ Doped Embedded SiGe Extension and Source/Drain for Enhanced PFET Performance," the contents of which are incorporated by reference herein. According to one exemplary embodiment, the source and drain regions 410 are embedded in situ boron doped SiGe source and drain regions which contain at least 10 percent (%) germanium (Ge), i.e., the embedded in situ boron doped SiGe source and drain regions contain from about 10% Ge to about 50% Ge, and are doped with boron to a concentration of from about $1\times10^{20}$ $cm^{-3}$ to about $3\times10^{21}$ $cm^{-3}$. Given the present teachings, one of skill in the art would be capable of fabricating embedded in situ boron doped SiGe having a Ge content and doping concentration with the above-specified parameters.

The use of embedded SiGe as the source and drain material is merely to illustrate the advantages of the present techniques in forming a silicide to a SiGe material without the use of a cap layer. The source and drain regions 410 may instead be formed, for example, from implantation or in situ doped Si. For instance, the source and drain regions 410 may be formed by implanting a dopant(s) into the SOI layer adjacent to/on opposite sides of the gate stack 402. By way of example only, suitable source/drain dopants include, but are not limited to, silicon (n-type) and carbon (p-type), wherein the particular dopant employed will depend on the device being formed (e.g., an n-channel FET or a p-channel FET, respectively). The implanted dopants can be activated using an anneal, for example, at a temperature of from about 400° C. to about 1,300° C. A pre-silicide clean may be performed at this point in the process to remove any native oxide on the source and drain regions. This pre-silicide clean process was described in detail above.

Figure 5:
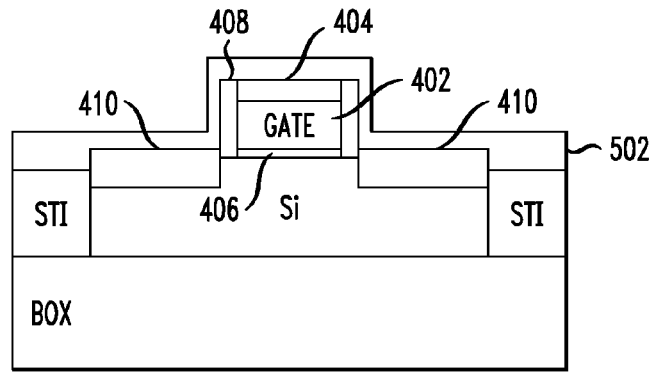
FIG. 5 is a cross-sectional diagram illustrating a silicide metal(s) having been is blanket deposited onto the wafer covering the source and drain regions according to an embodiment of the present invention.

Next, as shown in FIG. 5, a silicide metal(s) 502 is blanket deposited onto the wafer covering the source and drain regions 410. As provided above, suitable silicide metals include, but are not limited to, Ni, Pt and combinations including at least one of the foregoing metals, such as NiPt. The silicide metal(s) 502 may be deposited onto the wafer using, e.g., evaporation or sputtering.

In this particular example, a self-aligned silicide (a salicide) will be formed as source and drain region contacts. Advantageously, the silicide will form only where the silicide metal is deposited on exposed semiconductor material, in this case in the source and drain regions of the device. A metal strip will be performed later in the process to remove unreacted metal. As provided above, if a self-aligned silicide (salicide) is not desired, then the metal strip does not need to be performed (i.e., the unreacted metal remains), and thus this step is optional.

Figure 6:
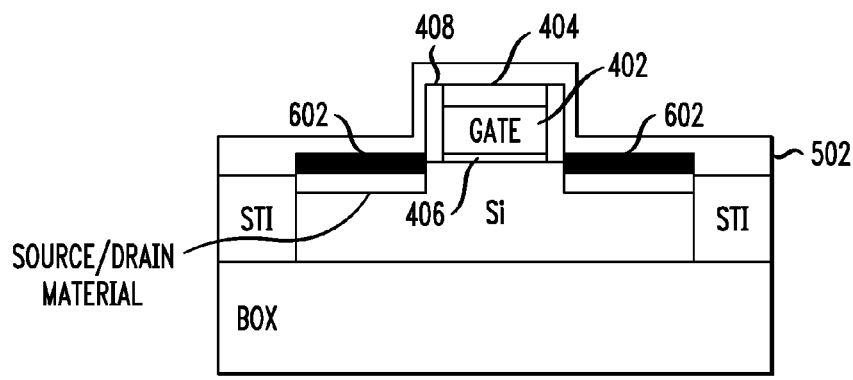
FIG. 6 is a cross-sectional diagram illustrating a fast anneal having been used to react the silicide metal(s) with the semiconductor material in the source and drain regions to form a silicide according to an embodiment of the present invention.

Next, as shown in FIG. 6, according to the present techniques, a fast anneal is used to react the silicide metal 502 with the semiconductor material in the source and drain regions 410 to form a silicide 602. As described above, it has advantageously been found by way of the present techniques that employing a high temperature, short duration anneal will result in a very smooth interface (see results described below), without the need for a capping layer. According to an exemplary embodiment, during this annealing step the silicide metal 502/semiconductor material in the source and drain regions 410 is heated to a temperature of from about 400° C. to about 800° C. for a duration of less than or equal to about 10 milliseconds, e.g., from about 1 microsecond to about 10 milliseconds. Such annealing conditions can be achieved using a flash or laser annealing process. According to an exemplary embodiment, the device is preheated to an initial temperature of from about 150° C. to about 350° C. prior to the fast anneal.

It is notable that the amount of silicide formed in this step is dependent on factors such as the amount of silicide metal 502 present, the annealing conditions, etc. It is desirable that the semiconductor is not fully consumed and (as shown in FIG. 6) following the silicide formation a portion of the source and drain region semiconductor material remains below the silicide 602, defining an interface between the silicide and the semiconductor (i.e., a silicide-semiconductor interface). It is within the capabilities of one of skill in the art to determine, given the specific annealing conditions and materials taught herein, for example, how much metal to deposit to achieve this desired result. As provided above, with the present techniques, the roughness at this silicide-semiconductor interface (i.e., interface roughness) is less than about 5 nm, e.g., from about 0.1 nm to about 5 nm, which is considered herein to be a smooth interface. As also provided above, the absence of a cap layer in the present techniques (which reduces production complexity—and thus production costs) means that the (post-silicide) semiconductor material underlying the silicide will have a uniform Ge concentration throughout, e.g., the Ge concentration in the semiconductor material does not vary by more than 3% anywhere in the semiconductor material, which is considered herein to be a uniform concentration. According to an exemplary embodiment, the silicide may have a uniform or non-uniform Ge concentration (see above).

Figure 7:
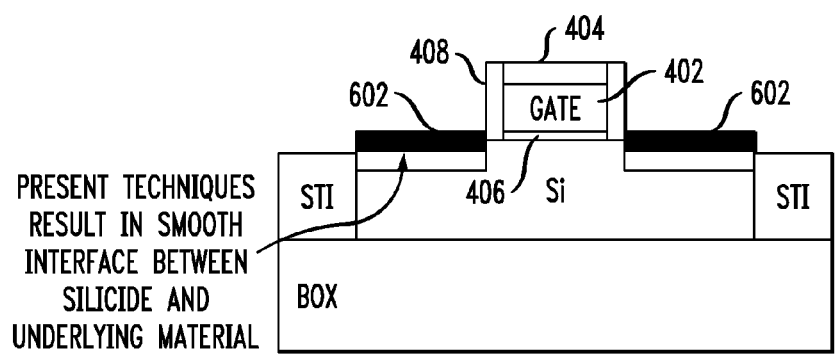
FIG. 7 is a cross-sectional diagram illustrating unreacted silicide metal(s) having been removed from the device to form self aligned source and drain region contacts according to an embodiment of the present invention.

In order to form contacts to only the source and drain regions of the device, it is desirable in this example to remove the unreacted metal. As shown in FIG. 7, the unreacted silicide metal(s) 502 has been removed from the device surfaces. As provided above, any unreacted silicide metal(s) 502 can be removed using a wet etching process. By way of example only, a suitable wet etching process for removing unreacted metal includes (but is not limited to) a soak in $H_2O$:HCl:$HNO_3$=4:5:1 for 10 minutes at 40° C. Again, this step is optional. In the case of a trench silicide process, for example, removal of the unreacted metal might not be necessary.

The result is the silicide 602 which is self-aligned to the source and drain regions of the device. This silicide 602 serves as contacts to the source and drain regions of the device.

As provided above, the present techniques provide a way to form a silicide in a Ge-containing (or other semiconductor) substrate without the use of a cap layer (cap layer-free), which results in a smooth interface between the silicide and the underlying substrate material. See, for example, FIG. 7. As described above, the 'smoothness' of this interface between the silicide and the underlying substrate material can be quantified based on interface roughness. Namely, as provided above, with the present techniques, the interface roughness is less than about 5 nm, e.g., from about 0.1 nm to about 5 nm, which is considered herein to be a smooth interface. As also provided above, the absence of a cap layer in the present techniques (which reduces production complexity—and thus production costs) means that the (pos-silicide) semiconductor material underlying the silicide will have a uniform Ge concentration throughout, e.g., the Ge concentration in the underlying semiconductor material does not vary by more than 3% anywhere in the semiconductor material, which is considered herein to be a uniform concentration. According to an exemplary embodiment, the silicide may have a uniform or non-uniform Ge concentration (see above).

The present techniques are further illustrated by way of reference to the following non-limiting examples. Samples were prepared as follows: 45 nm blanket epitaxial in situ boron doped SiGe layers were grown on counter-doped Si substrate (the sheet resistance Rs of the substrates→∞). The SiGe contained 30% Ge. Silicide formation was performed using 6 nm Ni 10% Pt with 3 different anneals (normal RTA—for comparison purposes, flash anneal with a peak temperature of 500° C. and flash anneal with a peak temperature of 600° C.). The RTA anneal was performed at 420° C. for 5 seconds. The flash anneals were both performed according to the above-described present techniques (e.g., at the above-stated temperatures for a duration of less than or equal to about 10 milliseconds). Unreacted metal was removed from each sample following the silicide formation. None of the samples used a cap layer.

Figure 8A:
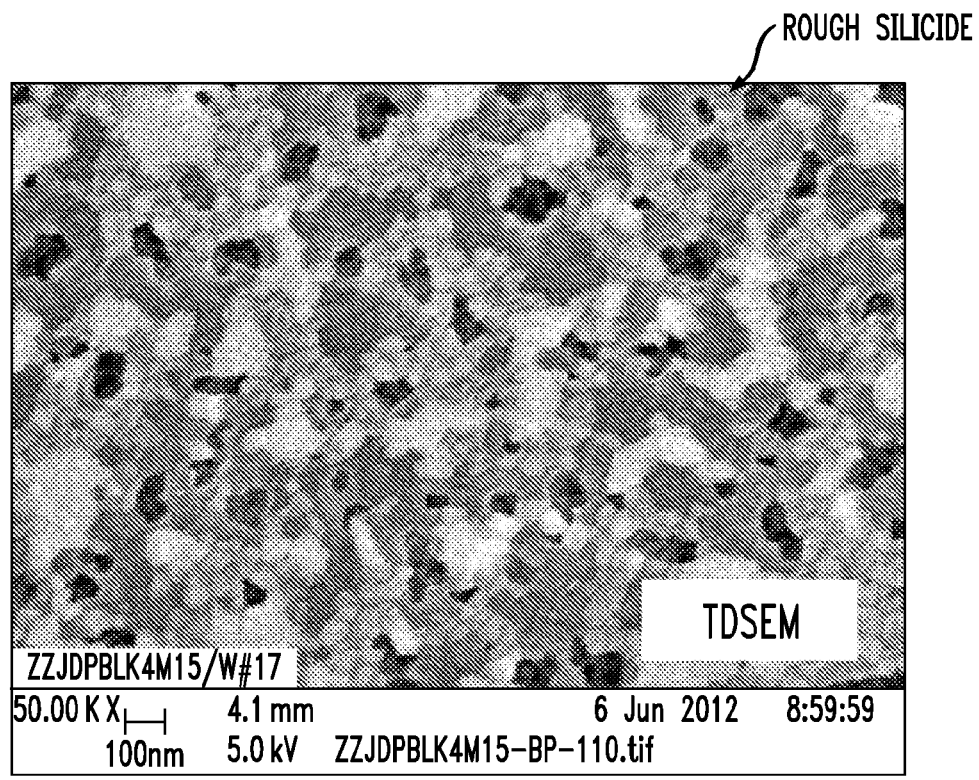
FIG. 8A is a top-down scanning electron micrograph (TDSEM) image of a SiGe silicide sample prepared using rapid thermal annealing (and no cap layer) according to an embodiment of the present invention.
Figure 8B:
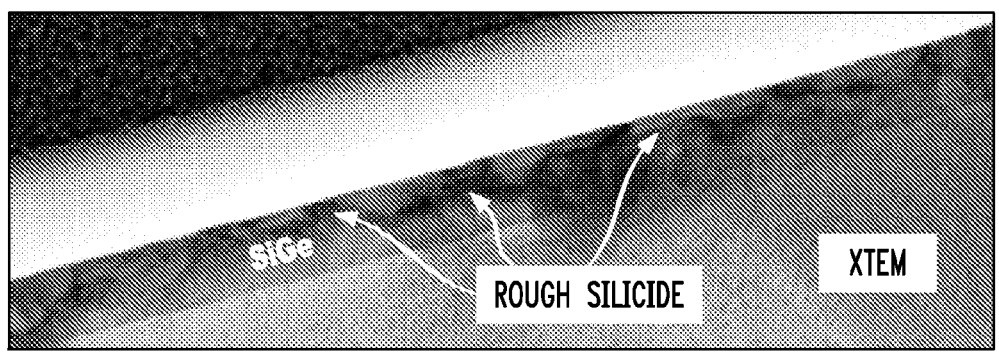
FIG. 8B is a cross-sectional transmission electron micrograph (XTEM) image of the SiGe silicide sample prepared using rapid thermal annealing (and no cap layer) according to an embodiment of the present invention.

Top-down scanning electron micrograph (TDSEM) and cross-sectional transmission electron micrograph (XTEM) images of the RTA anneal samples are shown in FIGS. 8A and 8B, respectively. As shown in FIG. 8A, which shows a top down view of the silicide, the silicide formed through RTA is very rough. It is notable that with conventional processes involving RTA, a cap layer would be employed. The cross-sectional view of the RTA sample shown in FIG. 8B illustrates the rough interface between the silicide and the underlying semiconductor substrate. The RTA sample had a sheet resistance Rs of 53 Ω/square.

Figure 9A:
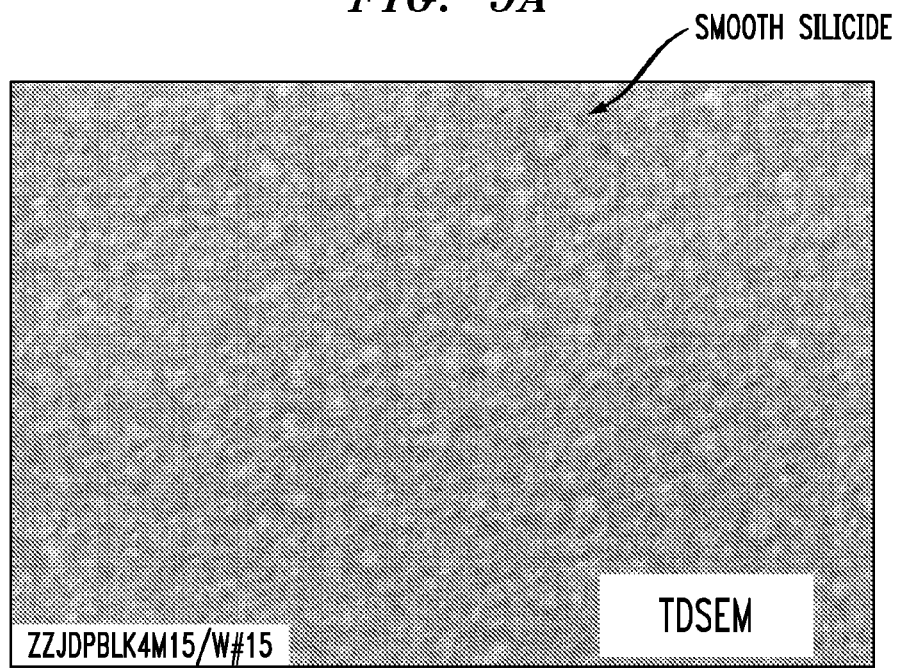
FIG. 9A is a TDSEM image of a SiGe silicide sample prepared using flash anneal with a peak temperature of 500° C. (and no cap layer) according to an embodiment of the present invention.
Figure 9B:
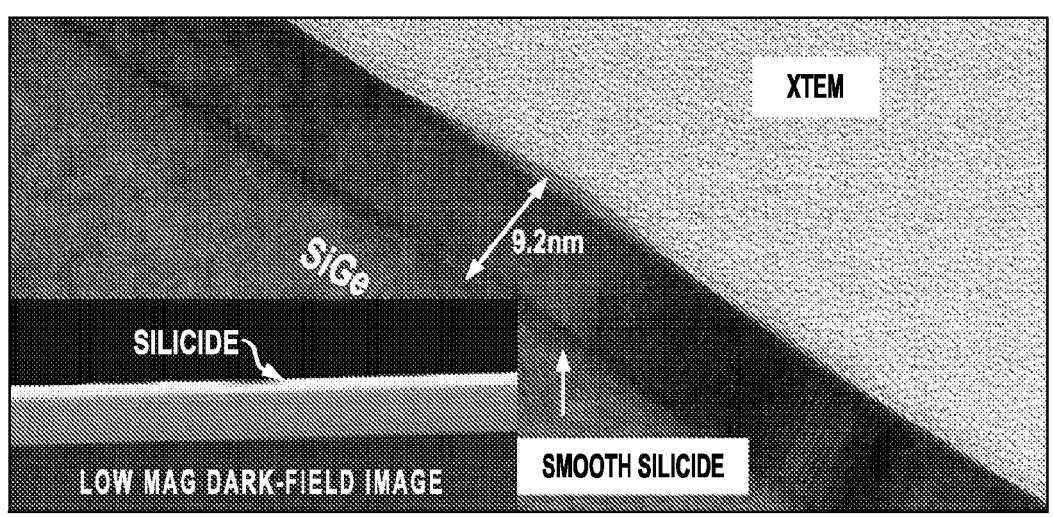
FIG. 9B is a XTEM image of the SiGe silicide sample prepared using flash anneal with a peak temperature of 500° C. (and no cap layer) according to an embodiment of the present invention.

TDSEM and XTEM images of the flash anneal samples with a peak temperature of 500° C. are shown in FIGS. 9A and 9B, respectively. As shown in FIG. 9A, which shows a top down view of the silicide, the silicide formed through flash anneal is very smooth. The cross-sectional view of the flash anneal sample shown in FIG. 9B illustrates the smooth interface between the silicide and the underlying semiconductor substrate. The flash anneal with a peak temperature of 500° C. sample had a sheet resistance Rs of 52 Ω/square.

Figure 10A:
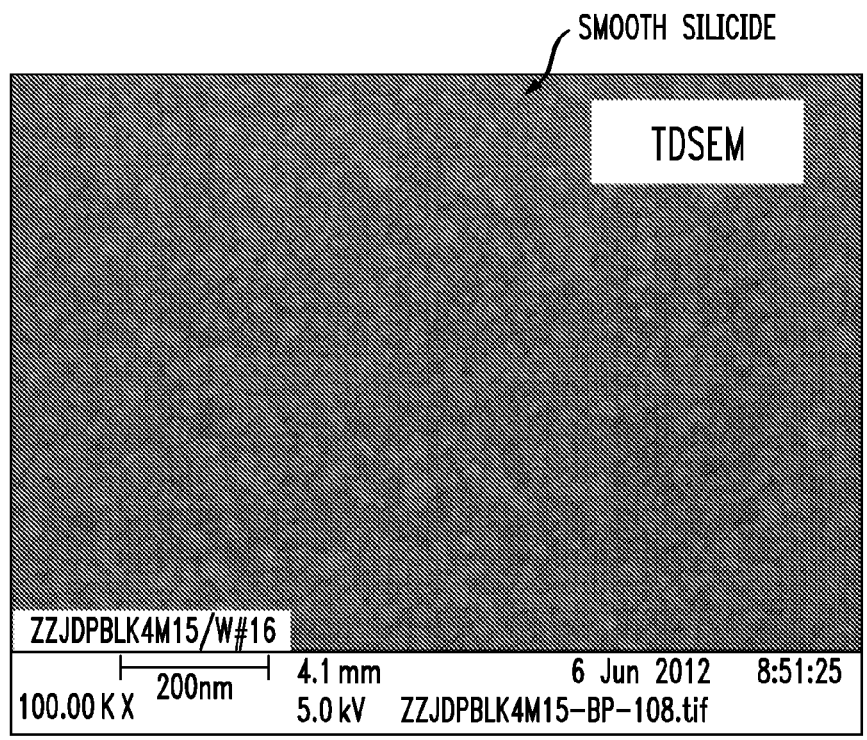
FIG. 10A is a TDSEM image of a SiGe silicide sample prepared using flash anneal with a peak temperature of 600° C. (and no cap layer) according to an embodiment of the present invention.
Figure 10B:
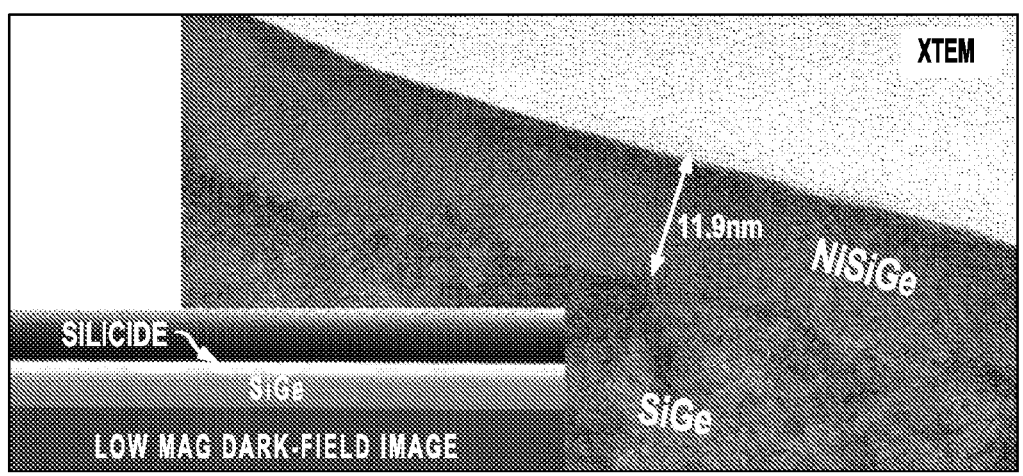
FIG. 10B is a XTEM image of the SiGe silicide sample prepared using flash anneal with a peak temperature of 600° C. (and no cap layer) according to an embodiment of the present invention.

TDSEM and XTEM images of the flash anneal samples with a peak temperature of 600° C. are shown in FIGS. 10A and 10B, respectively. As shown in FIG. 10A, which shows a top down view of the silicide, the silicide formed through flash anneal is very smooth. The cross-sectional view of the flash anneal sample shown in FIG. 10B illustrates the smooth interface between the silicide and the underlying semiconductor substrate. The flash anneal with a peak temperature of 600° C. sample had a sheet resistance Rs of 28 Ω/square.

Although illustrative embodiments of the present invention have been described herein, it is to be understood that the invention is not limited to those precise embodiments, and that various other changes and modifications may be made by one skilled in the art without departing from the scope of the invention.

What is claimed is:

1. A field-effect transistor (FET) device, comprising:
a silicon-on-insulator (SOI) wafer having a SOI layer over a buried oxide (BOX) and at least one active area formed in the wafer;
a gate stack over a portion of the at least one active area which serves as a channel of the device;
source and drain regions of the device, raised above a surface of the SOI layer, adjacent to the gate stack, wherein the source and drain regions of the device comprise a semiconductor material comprising silicon germanium; and
silicide contacts on and covering an entire top surface of each of the source and drain regions of the device, wherein the semiconductor material underlies each of the silicide contacts such that an interface is present between the silicide contacts and the semiconductor material, wherein the interface has an interface roughness of less than about 5 nanometers, wherein the semiconductor material that underlies each of the silicide contacts comprises a layer of the semiconductor material one side of which is in contact with the SOI layer and another side of which is in contact with the silicide contacts, and wherein a concentration of germanium is uniform throughout the semiconductor material that underlies each of the silicide contacts in that the concentration of germanium in the semiconductor material does not vary by more than 3 percent anywhere in the semiconductor material.

2. The FET device of claim 1, wherein the interface has an interface roughness of from about 0.1 nanometers to about 5 nanometers.

3. The FET device of claim 1, further comprising:
spacers on opposite side of the gate stack.

4. The FET device of claim 3, wherein the spacers comprise a nitride material.

5. The FET device of claim 1, wherein a concentration of germanium in the silicide contacts is uniform throughout the silicide contacts in that the concentration of germanium in the silicide contacts does not vary by more than 3 percent anywhere in the silicide contacts.

6. The FET device of claim 5, wherein the semiconductor material comprises in situ boron doped silicon germanium.

7. The FET device of claim 1, wherein a gate dielectric is present between the gate stack and the at least one active area which serves as the channel of the device.

8. The FET device of claim 7, wherein the gate dielectric comprises a high-k dielectric.

9. The FET device of claim 7, wherein the gate dielectric comprises an oxide.

10. The FET device of claim 1, wherein the gate stack comprises one or more metals.

11. The FET device of claim 1, wherein the gate stack comprises doped poly silicon.

12. The FET device of claim 1, wherein the silicide contacts comprise a silicide metal selected from the group consisting of: nickel platinum and titanium platinum.

* * * * *